(12) United States Patent
Maeda et al.

(10) Patent No.: US 10,931,207 B2
(45) Date of Patent: *Feb. 23, 2021

(54) POWER CONVERTER HAVING SWITCHING ELEMENTS FORMED OF UNIPOLAR DEVICES USING A WIDEBAND GAP SEMICONDUCTOR

(71) Applicant: DAIKIN INDUSTRIES, LTD., Osaka (JP)

(72) Inventors: Toshiyuki Maeda, Osaka (JP); Morimitsu Sekimoto, Osaka (JP); Hiroshi Hibino, Osaka (JP)

(73) Assignee: DAIKIN INDUSTRIES, LTD., Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/017,208

(22) Filed: Jun. 25, 2018

(65) Prior Publication Data

US 2018/0309390 A1 Oct. 25, 2018

Related U.S. Application Data

(62) Division of application No. 12/865,590, filed as application No. PCT/JP2009/000205 on Jan. 21, 2009, now Pat. No. 10,148,197.

(30) Foreign Application Priority Data

Jan. 31, 2008 (JP) .................................. 2008-021759

(51) Int. Cl.
*H02M 7/797* (2006.01)
*H02M 7/5387* (2007.01)
(Continued)

(52) U.S. Cl.
CPC ......... *H02M 7/797* (2013.01); *H02M 7/5387* (2013.01); *H03K 17/08142* (2013.01);
(Continued)

(58) Field of Classification Search
CPC .......................... H02M 7/797; H02M 7/5387
See application file for complete search history.

(56) References Cited

U.S. PATENT DOCUMENTS 4,953,068 A 8/1990 Henze
5,126,931 A * 6/1992 Jitaru ................ H02M 3/33569
363/131

(Continued)

FOREIGN PATENT DOCUMENTS

JP 9-182440 A 7/1997
JP 10-327585 A 12/1998
(Continued)

OTHER PUBLICATIONS

Funaki et al. "A Study on SiC Devices in Synchronous Rectification of DC-DC Converter", Applied Power Electronics Conference, APEC 2007, 22nd Annual IEEE, IEEE, PI, Feb. 1, 2007, pp. 339-344, XP031085232, ISBN: 978-1-4244-0713-2.
(Continued)

*Primary Examiner* — Kyle J Moody
*Assistant Examiner* — Lakaisha Jackson
(74) *Attorney, Agent, or Firm* — Birch, Stewart, Kolasch & Birch, LLP

(57) ABSTRACT

An inverter circuit (120) is configured so as to perform synchronous rectification by six switching elements (130). The switching element (130) is formed of an unipolar device (SiC MOSFET in this case) using a wideband gap semiconductor. The inverter circuit (120) uses the body diode (131) of SiC MOSFET (130) as a freewheeling diode during synchronous rectification.

6 Claims, 6 Drawing Sheets

(51) Int. Cl.
*H03K 17/0814* (2006.01)
*H02M 7/219* (2006.01)
*H02M 1/00* (2006.01)

(52) U.S. Cl.
CPC ............... *H02M 2001/0051* (2013.01); *H02M 2007/2195* (2013.01); *Y02B 70/10* (2013.01)

(56) References Cited

U.S. PATENT DOCUMENTS

| | | | | |
|---|---|---|---|---|
| 5,742,498 | A * | 4/1998 | Taniguchi | H02J 7/248 322/16 |
| 5,808,327 | A * | 9/1998 | Maier | H02H 9/025 257/161 |
| 5,815,388 | A | 9/1998 | Manley et al. | |
| 5,845,388 | A | 12/1998 | Andrews et al. | |
| 6,058,037 | A | 5/2000 | Shibata et al. | |
| 6,657,475 | B1 * | 12/2003 | Zahn | H02H 9/047 327/309 |
| 6,700,803 | B2 * | 3/2004 | Krein | H02M 7/5395 363/41 |
| 6,850,424 | B2 * | 2/2005 | Baudelot | H02M 5/4585 363/37 |
| 7,218,122 | B1 * | 5/2007 | Nastasi | G01R 31/001 324/107 |
| 7,791,308 | B2 * | 9/2010 | Kitabatake | H01L 24/48 318/801 |
| 2004/0169975 | A1 * | 9/2004 | Muenzer | H02H 9/047 361/91.1 |
| 2006/0267541 | A1 * | 11/2006 | Battello | H02P 6/085 318/801 |
| 2007/0040534 | A1 * | 2/2007 | Ghosh | H02M 1/4233 323/207 |
| 2007/0215903 | A1 | 9/2007 | Sakamoto et al. | |
| 2008/0002444 | A1 * | 1/2008 | Shekhawat | H02M 1/34 363/127 |
| 2008/0135871 | A1 * | 6/2008 | Ruething | H01L 21/22 257/139 |
| 2008/0173877 | A1 * | 7/2008 | Yamaguchi | H01L 31/1136 257/80 |
| 2009/0168471 | A1 * | 7/2009 | Tsugawa | H03K 17/08148 363/56.01 |
| 2009/0200981 | A1 * | 8/2009 | Lumsden | H02P 23/02 318/812 |
| 2009/0218972 | A1 * | 9/2009 | Yamamoto | H02P 6/14 318/400.28 |
| 2009/0231018 | A1 * | 9/2009 | Dittrich | H03K 17/063 327/365 |
| 2011/0272397 | A1 * | 11/2011 | Artal Lahoz | H05B 6/1272 219/622 |

FOREIGN PATENT DOCUMENTS

| | | |
|---|---|---|
| JP | 2003-199339 A | 7/2003 |
| JP | 2006-320134 A | 11/2006 |
| JP | 2007-129846 A | 5/2007 |
| JP | 2007-129848 A | 5/2007 |
| JP | 2007-215389 A | 8/2007 |
| JP | 2007-281443 A | 10/2007 |

OTHER PUBLICATIONS

Arai et al., "Basic and Application of SiC Devices", Ohmsha, Ltd., pp. 176-177 and 236-241, 1996.

Baliga, "Power Semiconductor Devices." Power Semiconductors, PWS Pubisihing Company, Boston, MA; 1995, pp. 402-403.

Chow et al, "Recent Advances in High-Voltage SiC Power Devices," IEEE, 1998, pp. 55-67.

Matsunami, "Semiconductor SiC Technology and Application", Nikkan Kogyo Shimbun Ltd., pp. 176-176-179, 186-187 and 248-251, 2003.

Matsukawa et al. "Application of SiC-based power element to high current AC/DC converter system", Fusion Engineering and Design, Elsevier Science Publishers, Amsterdam, NL, vol. 66-68, Sep. 1, 2003, pp. 1155-1158, XP004456632, ISSN: 0920-3796.

* cited by examiner (b) With Synchronous Rectification (a) Without Synchronous Rectification (a)

(b)

POWER CONVERTER HAVING SWITCHING ELEMENTS FORMED OF UNIPOLAR DEVICES USING A WIDEBAND GAP SEMICONDUCTOR

CROSS REFERENCE TO RELATED APPLICATIONS

This application is a Division of copending application Ser. No. 12/865,590, filed on Jul. 30, 2010 which is the National Phase under 35 U.S.C. § 371 of International Application No. PCT/JP2009/000205, filed on Jan. 21, 2009, which claims the benefit under 35 U.S.C. § 119(a) to Patent Application No. 2008-021759, filed in Japan on Jan. 31, 2008, all of which are hereby expressly incorporated by reference into the present application.

TECHNICAL FIELD

The present invention relates to a power converter having switching elements formed of unipolar devices using a wideband gap semiconductor.

BACKGROUND ART

As a material for switching elements for a power converter, silicon are widely used at present. However, the characteristics of switching elements made of silicon have almost reached their theoretical limits. As the materials that exceed the theoretical limit of silicon, there exist wideband gap semiconductors such as SiC (silicon carbide), GaN (gallium nitride) and diamond, the development of these being in progress. Power devices using wideband gap semiconductors have super low-loss and high-speed high-temperature operation characteristics. Of these wideband gap semiconductors, the most remarkable one is the SiC device, and SiC MOSFETs are regarded as promising switching for power converter.

In inverter circuits and the like that drive inductive loads, a diode is connected in parallel with a switching element. The diode of this kind is called a freewheeling diode, and functions to flow a reverse current. In an inverter using a SiC MOSFET as a switching element, a study on a configuration in which a SiC Schottky barrier diode (hereinafter SiC SBD) is connected in parallel with the SiC MOSFET, and the SiC SBD is used as a freewheeling diode, has been made.

CITATION LIST

Patent Document

PATENT DOCUMENT 1: Japanese Patent Publication No. H10-327585

PATENT DOCUMENT 2: Japanese Patent Publication No. 2007-129848

Non-Patent Document

NON-PATENT DOCUMENT 1: Nikkan Kogyo Shimbun Ltd. "Semiconductor SiC Technology and Application", written and edited by Hiroyuki Matsunami, 2003

NON-PATENT DOCUMENT 2: Ohmsha, Ltd. "Basic and Application of SiC Devices", edited by Kazuo Arai and Sadafumi Yoshida, 2003

SUMMARY OF THE INVENTION

Technical Problem

Provision of the configuration as above makes it possible to reduce loss at the freewheel diode, but this configuration causes a problem of the apparatus becoming bulky and increasing in cost because the SiC SBD is needed.

Solution to the Problem

A power converter of the present invention is configured so as to perform synchronous rectification by means of a switching element (130), and is characterized in that the switching element (130) is comprised of a unipolar device using a wideband gap semiconductor, and the body diode (131) inside the unipolar device is used as a freewheeling diode.

The power converter is characterized in that the unipolar device turns on when a reverse current flows through the body diode (131) used as the freewheeling diode, so that the reverse current flows through the unipolar diode, thereby performing synchronous rectification.

In this way, use of the body diode (131) makes it possible to provide a configuration with the switching element (130) only without the need of providing a separate freewheeling diode (132), hence reduce cost. Further, execution of synchronous rectification makes it possible to make the switching element (130) conduct and inhibit conduction loss more than the body diode (131) alone does.

The power converter is characterized in that the power converter is used for an air conditioner. Further, the power converter is characterized in that the relationship between the effective current value ($I_{rms}$) and the on-resistance ($R_{on}$) of the switching element (130) under intermediate load condition of heating operation of the air conditioner, satisfies: $I_{rms} < 0.9/R_{on}$.

When synchronous rectification is performed with the switching element selected in this way, it is possible to attain an equivalent or greater efficiency without providing a separate freewheeling diode (132), hence achieve both cost reduction and high efficiency in the intermediate load condition of heating operation.

The apparatus is characterized in that any one of SiC, GaN and diamond is used as the wideband gap semiconductor.

The apparatus is characterized in that the unipolar device is a MOSFET.

The power converter is characterized in that, of an inverter (120), converter (110), matrix converter (700) and boosting chopper circuit (111) which are constructed to perform synchronous rectification by means of the switching element (130), at least one is included.

Advantages of the Invention

In the power converter of the present invention, since the body diode (131) of switching element (130) is used as a freewheeling diode, it is possible to reduce cost without the need of providing a separate freewheeling diode (132). Further, execution of synchronous rectification enables a reverse current to flow through the switching element (130) and inhibit conduction loss more than the body diode (131) alone does. When synchronous rectification is carried out by selecting the switching element so that the relationship between the effective current value (Inns) and the on-resistance ($R_{on}$) of the switching element (130) under intermediate load condition of heating operation of the air conditioner, satisfies: $I_{rms} < 0.9/R_{on}$, it is possible to attain an equivalent or greater efficiency without providing a separate freewheeling diode (132), hence achieve both cost reduction and high efficiency in the intermediate load condition of heating operation.

BRIEF DESCRIPTION OF THE DRAWINGS

FIG. 7 (b) is a diagram showing a configuration of the bidirectional switch (710) shown in FIG. 7 (a).

Figure 1:
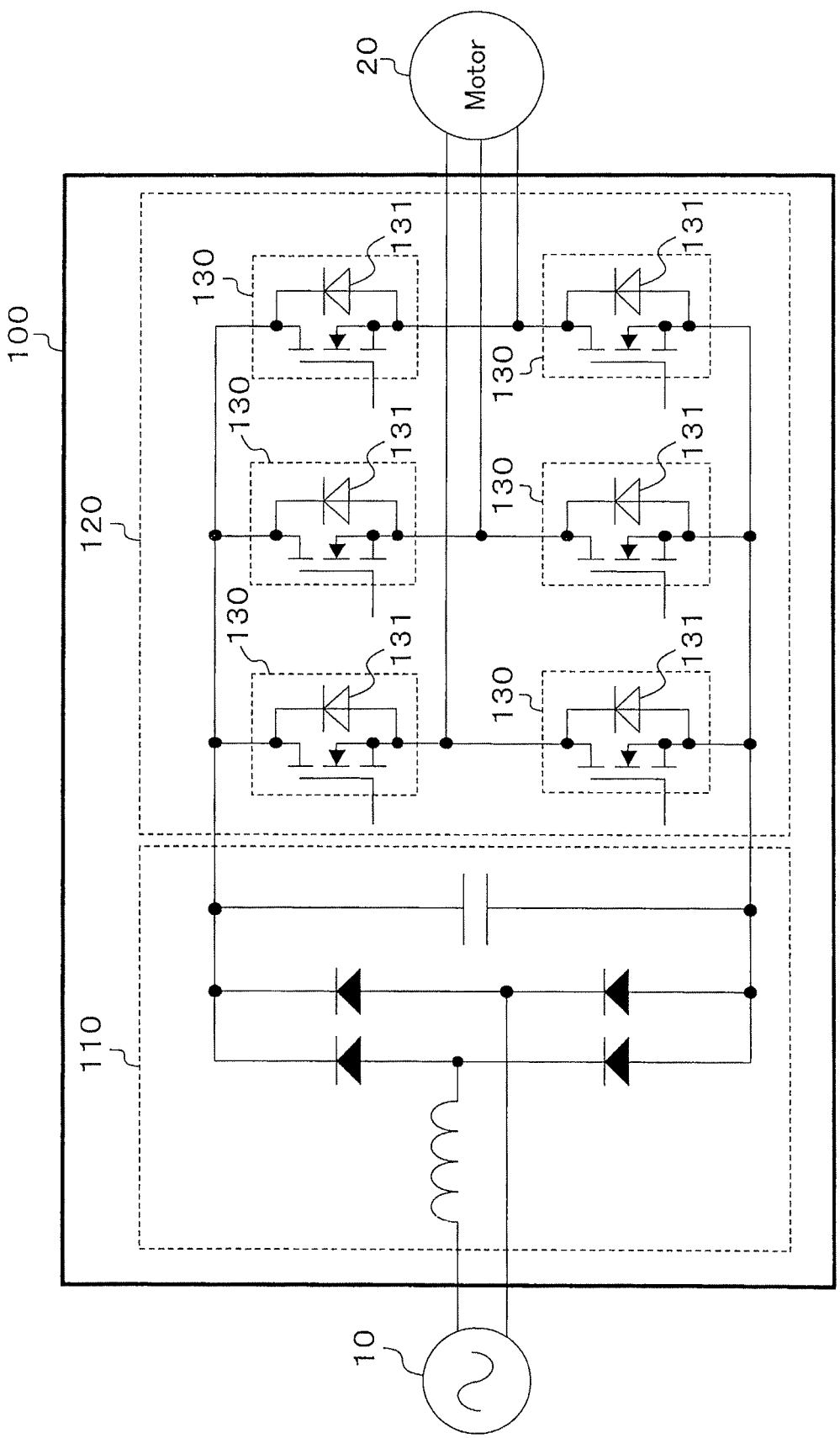
FIG. 1 is a diagram showing a configuration of a power converter according to the first embodiment of the present invention.

DESCRIPTION OF REFERENCE CHARACTERS 10 a.c. power source
20 motor
100, 500, 600 power converter
110 converter circuit
111 boosting chopper circuit (power factor enhancement circuit)
120 inverter circuit
130 SiC MOSFET (switching element)
131 body diode
700 matrix converter

DESCRIPTION OF EMBODIMENTS

Now, the embodiments of the present invention will be described with reference to the drawings. In the drawings, the identical parts or corresponding parts are allotted with the same reference characters and description of those will not be repeated. The description of the preferred embodiments is a mere example in nature, and is not intended to limit the scope, applications and use of the invention.

The First Embodiment

FIG. 1 shows a configuration of a power converter according to the first embodiment of the present invention. This power converter (100) rectifies alternating voltage of an a.c. power supply (10) using a converter circuit (110) and converts the direct current into a three-phase current by means of an inverter circuit (120) to supply the resultant current to a motor (20). This motor (20) is to drive a compressor that is provided for a refrigerant circuit in an air conditioner. Here, in FIG. 1 the a.c. power supply (10) is assumed to supply a single-phase current, but may supply a three-phase current.

Figure 2:
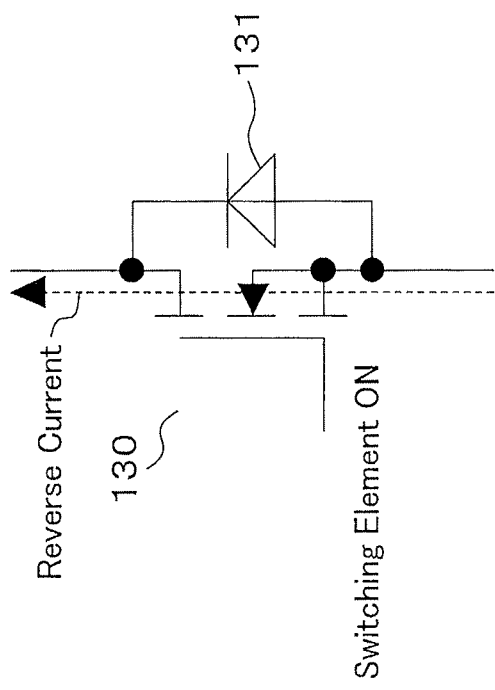
FIG. 2 is a diagram showing the basic concept of synchronous rectification.
Figure 2:
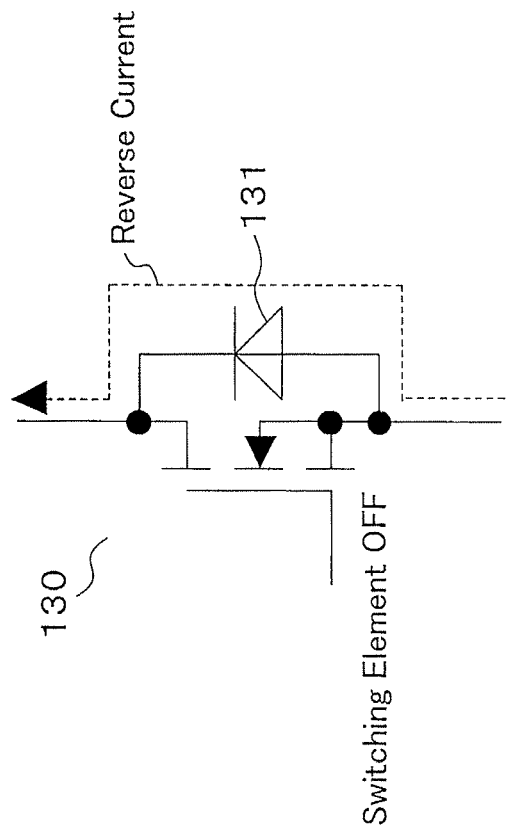

The inverter circuit (120) is configured such that synchronous rectification is performed by six switching elements (130). The switching element (130) is comprised of a unipolar device (SiC MOSFET herein) using a wideband gap semiconductor. The inverter circuit (120) uses the body diode (131) of the SiC MOSFET (130) as a freewheeling diode when performing synchronous rectification. Here, synchronous rectification is a control method whereby the SiC MOSFET (130) is turned on when a reverse current flows through the freewheeling diode (131) to flow the reverse current to the MOSFET side, as shown in FIG. 2. This makes it possible to reduce conduction loss when a reverse current flows.

As a conventional technology for performing synchronous rectification using the body diode as a freewheeling diode, there exists a technique in which the body diode of a Si MOSFET is used as a freewheeling diode. However, since the turn-on voltage of the body diode of a Si MOSFET is low (about 0.7V), the body diode instantly turns on even if synchronous rectification is carried out. Accordingly, synchronous rectification has little effect. In contrast to this, in the case where the body diode (131) of the SiC MOSFET (130) is used as a freewheeling diode as in the present embodiment, since the turn-on voltage of the body diode (131) of the SiC MOSFET (130) is high (about 3V), the body diode (131) will not turn on unless the current becomes large when synchronous rectification is carried out. As a result, when the body diode (131) of the SiC MOSFET (130) is used a freewheeling diode as in the present embodiment, synchronous rectification provides a greater effect than in the case where the body diode of a Si MOSFET is used as a freewheeling diode.

When the body diode of the Si MOSFET is used a freewheeling diode so as to achieve synchronous rectification, there is the problem that a recovery current flows due to the body diode. To deal with, some ways such as lowering the switching speed to reduce recovery current, manipulating the circuit configuration so that no current will flow through the body diode, or reducing the loss due to recovery current by providing an additional circuit, have been devised (Patent Documents 1 and 2).

Figure 3:
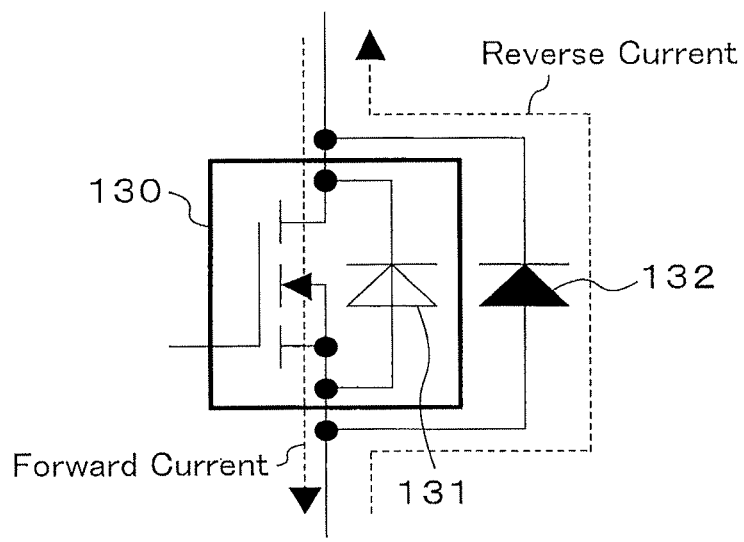
FIG. 3 is a diagram showing one example of a configuration in which a SiC SBD is connected in parallel with a SiC MOSFET so as to be used as a freewheel diode.

As described in Background Art, when a SiC MOSFET is used as a switching element, a study on the configuration in which a SiC SBD (132) is connected in parallel with the SiC MOSFET (130) so as to be used as a freewheeling diode has been made, as shown in FIG. 3. In this configuration, since there is a large difference between the turn-on voltage (about 3V) of the body diode (131) of the SiC MOSFET (130) and the turn-on voltage (abut 1V) of SiC SBD, it is possible to flow a reverse current through only the SiC SBD (132) that is less in recovery current while no reverse current will flow through the body diode (131). It is known that a SiC SBD can markedly reduce recovery current and switching loss. In this way, SiC MOSFET can easily reduce recovery current as compared to the case of a Si MOSFET. Here, with a Si MOSFET, the turn-on voltage of the diode that can be connected in parallel and used as a freewheeling diode, is as low as that of the body diode of the Si MOSFET, hence it is impossible to prevent any reverse current from flowing through the body diode.

On the other hand, because the recovery current of a SiC pn diode having the same structure as the body diode (131) of the SiC MOSFET (130) is small, its switching loss is an order of magnitude lower than that of a Si pn diode.

Accordingly, it is possible to significantly reduce the recovery current and switching loss in the present embodiment.

As needing the SiC SBD (132), the configuration shown in FIG. 3 poses a cost increase problem. However, when the body diode (131) of the SiC MOSFET (130) is used as freewheeling diode so as to effect synchronous rectification as in the present embodiment, it is possible to provide a configuration with the SiC MOSFET (130) only without the need of providing the SiC SBD (132), hence the cost can be reduced. Further, use of synchronous rectification makes it possible to make the MOSFET side conductive and reduce the conduction loss compared to the case where the body diode (131) is used alone. In particular, under light load conditions, it is possible to inhibit loss compared to the case where the SiC SBD (132) is used (this aspect will be described later).

Though in FIG. 1, the configuration for effecting synchronous rectification by using the body diode (131) as a freewheeling diode is applied to all the six switching elements (130) in the inverter circuit (120), it is possible to apply this to part of switching elements (130) only.

(Switching Element Selecting Conditions)

Figure 4:
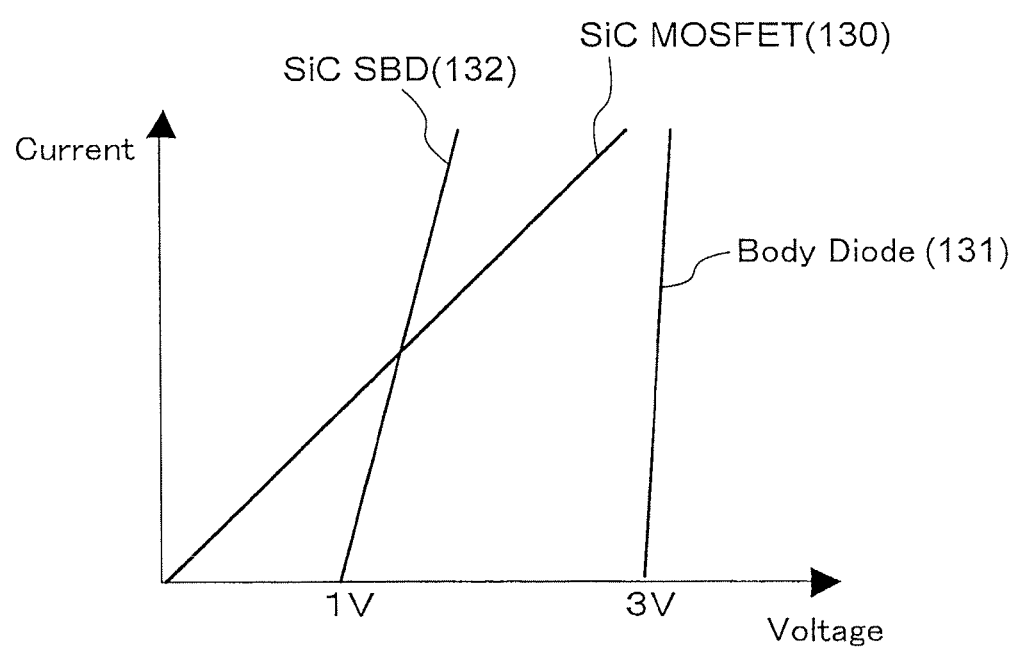
FIG. 4 is a diagram schematically showing the voltage-current characteristics of a SiC MOSFET, the body diode of a SiC MOSFET and a SiC SBD (132).

In the inverter circuit (120) of the present embodiment, the SiC MOSFET (130) turns on by virtue of synchronous rectification. In the conventional configuration (the configuration in which the SiC SBD (132) is connected in parallel with the SiC MOSFET (130) and is used as a freewheeling diode, see FIG. 3), the SiC SBD (132) turns on. Here, FIG. 4 schematically shows the voltage-current characteristics of the SiC MOSFET (130), the body diode (131) of the SiC MOSFET (130) and the SiC SBD (132). The SiC MOSFET (130) shows a fixed resistance characteristic. The turn-on voltage of the SiC SBD (132) is about IV and the turn-on voltage of the body diode (131) of the SiC MOSFET (130) is about 3V. The turn-on voltages are determined depending on physical properties, and cannot be set arbitrarily.

Comparing the characteristics between the configuration of the present embodiment and the conventional configuration (FIG. 3), when the terminal voltage is equal to or lower than the turn-on voltage of the SiC SBD (132), the present embodiment is more efficient. However, as the current further increases, the conventional configuration presents higher efficiency. Accordingly, in an operating mode in which a large current is flowed under the rated conditions or heavy load conditions, the conventional configuration using the SiC SBD (132) presents higher efficiency. On the other hand, under light load conditions, the SiC SBD (132) has little effect so that the configuration of the present embodiment with the SiC MOSFET (130) alone presents higher efficiency.

Here, the loss of the present embodiment and the configuration (FIG. 3) when current $i=(\sqrt{2})I_{rms} \sin\theta$ flows, is represented by the following formulas 1 to 3.

The present embodiment $$R_{on} \times I_{rms}^2 \quad \text{(Formula 1)}$$

The conventional configuration $$Vf \times (2\sqrt{2}/\pi)Irms \ldots \text{where } Vf=\text{const} \quad \text{(Formula 2)}$$

$$\alpha I_{rms}^2 + \beta(2\sqrt{2}/\pi)Irms \ldots \text{where } Vf=\alpha i+\beta \quad \text{(Formula 3)}$$

$I_{rms}$ is the effective value of the current, $R_{on}$ is the on-resistance of the SiC MOSFET (130), Vf is the terminal voltage of the SiC SBD (132). (Formula 2) is an approximation when Vf is set at a constant value. (Formula 3) is an approximation when Vf is approximated in the first order.

As understood from FIG. 4 and the above formulae, the present embodiment shows a greater loss under the rated condition or under heavy load conditions but shows a smaller loss under light load conditions. Unlike typical load conditions where the efficiency at the rated load is regarded as important, in air conditioning usage, the operating time under light load conditions is longer. Therefore, for effective energy saving, an operation efficiency under light load conditions is demanded. The operating condition having the greatest influence on the effective energy saving within Japan is the condition called the intermediate load condition of heating operation in which operation is performed at half the rated heating capacity.

When the effective current at the half heating load is the SiC MOSFET (130) is selected so that the conditions meeting the following (formula 4) and (formula 5) will hold.

$$I_{rms1} < (2\sqrt{2}/\pi)Vf/R_{ori} \ldots \text{where } Vf=\text{const.} \quad \text{(Formula 4)}$$

$$I_{rms1} < (2\sqrt{2}/\pi)\beta/R_{on}-\alpha) \ldots \text{where } Vf(i)=\alpha i+\beta. \quad \text{(Formula 5)}$$

When synchronous rectification is performed with the switching element selected in this way, it is possible to attain an equivalent or greater efficiency without use of the SiC SBD (132) and hence achieve both cost reduction and high efficiency.

Further, taking into account that the turn-on voltage of the SiC SBD (132) is about IV, the above (formula 4) can be simplified as in (formula 6) below when Vf is set at 1V.

$$I_{rms1} < 0.9/R_{on}. \quad \text{(Formula 6)}$$

This further simplifies selection of the switching element.

The Second Embodiment

Figure 5:
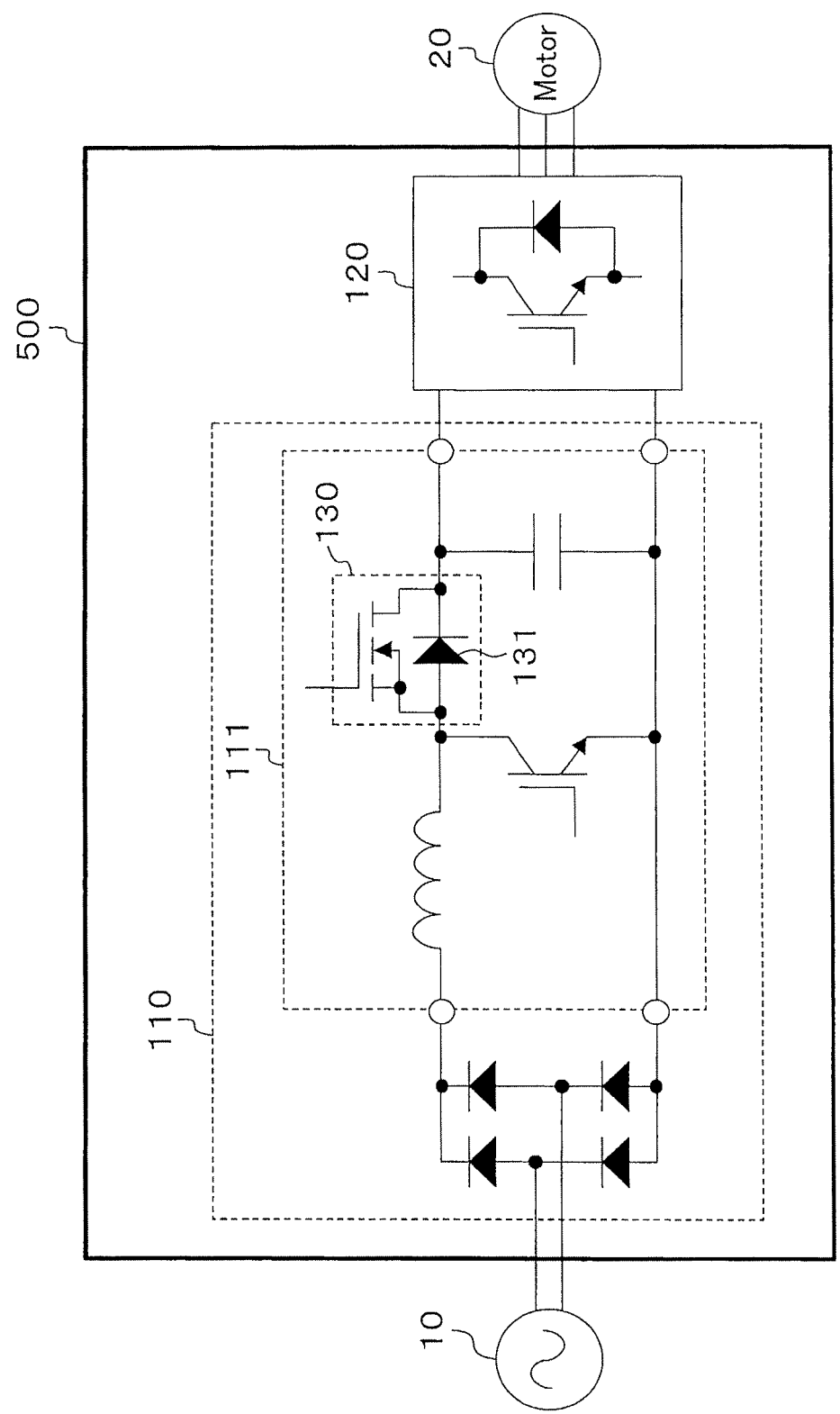
FIG. 5 is a diagram showing a configuration of a power converter according to the second embodiment of the present invention.

FIG. 5 shows a configuration of a power converter according to the second embodiment of the present invention. This power converter (500) performs synchronous rectification, using the body diode (131) of a SiC MOSFET (130) as the diode for a boosting chopper circuit (111) used as a power factor enhancement circuit. With this synchronous rectification, efficiency is improved, especially under light load conditions. Further, since a SiC device is used, the recovery current is made markedly low compared to that with a Si device so that it is possible to reduce switching loss.

The Third Embodiment

Figure 6:
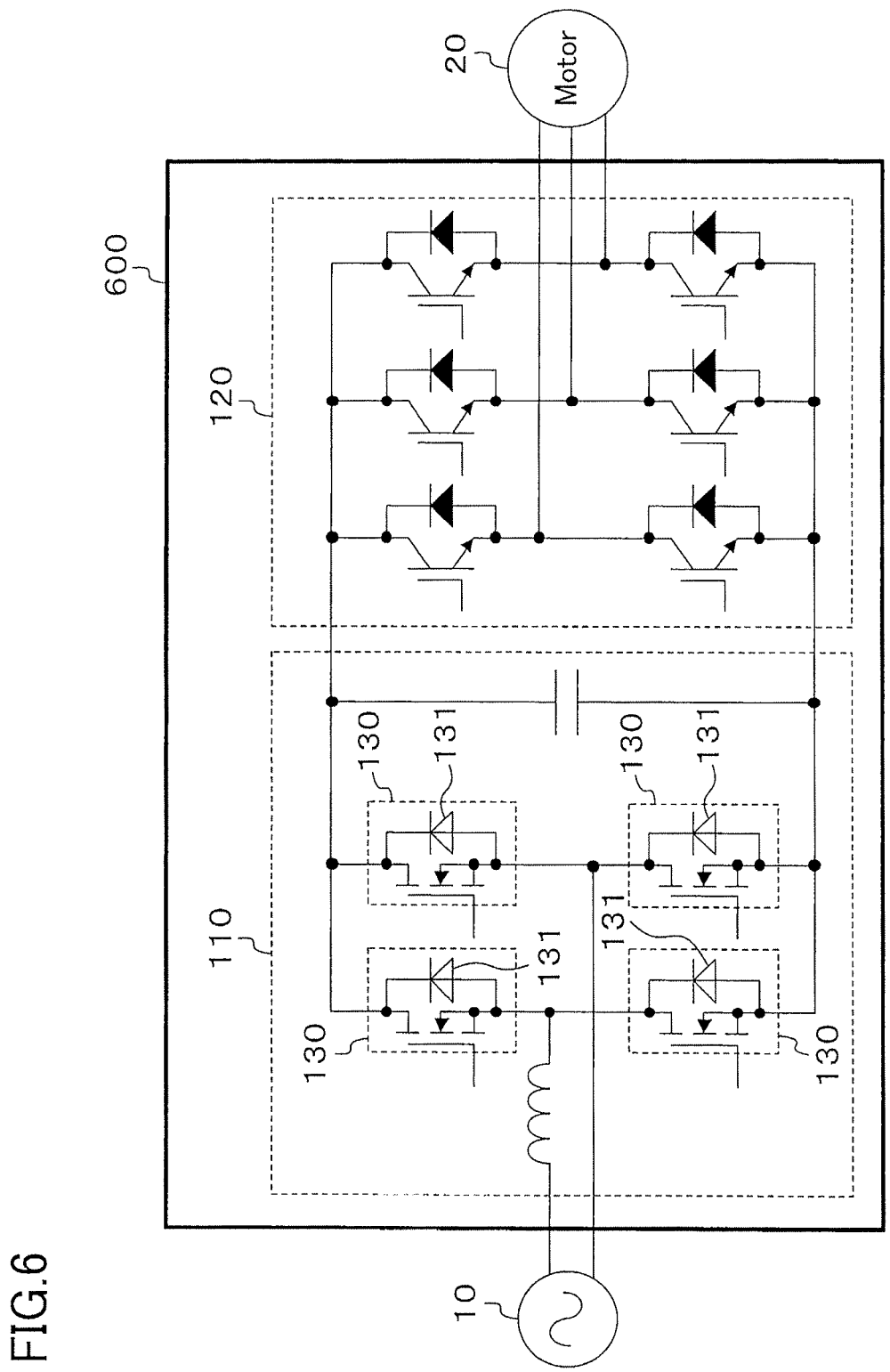
FIG. 6 is a diagram showing a configuration of a power converter according to the third embodiment of the present invention.

FIG. 6 shows a configuration of a power converter according to the third embodiment of the present invention. This power converter (600) performs synchronous rectification, using the body diodes (131) in SiC MOSFETs (130) as the rectifying diodes for a converter circuit (110). Though in FIG. 6, a commercial power supply (10) is assumed to be a single-phase alternating current, three-phase alternating current may be used. Further, only part of the rectifying diodes in the converter circuit (110) may use the body diode (131) of the SiC MOSFET (130) while the others may use usual diodes.

The Fourth Embodiment

Figure 7:
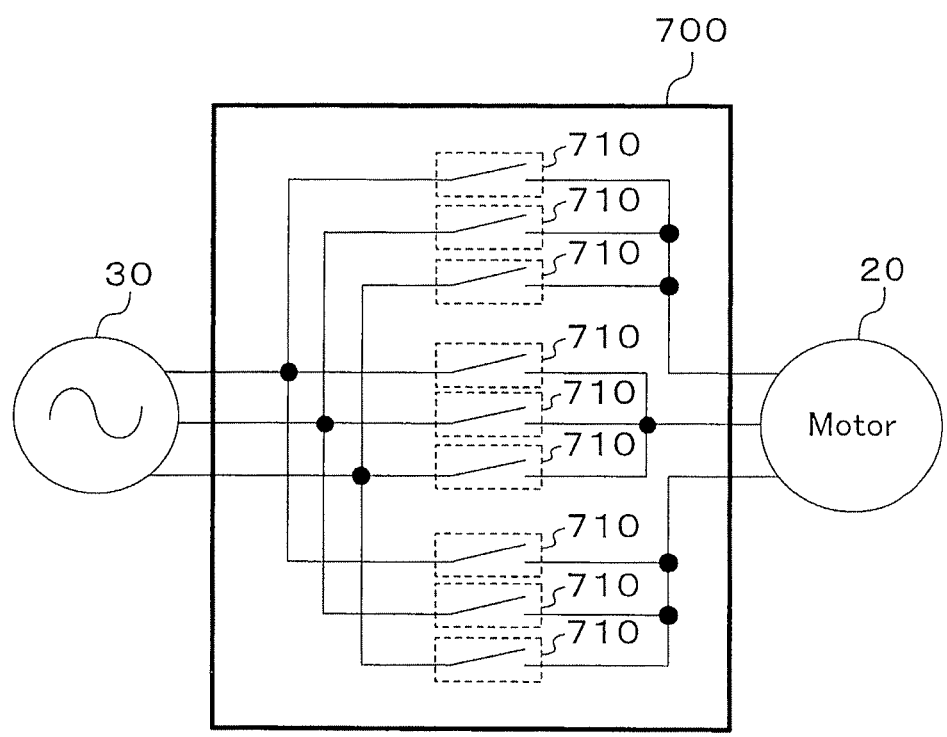
FIG. 7 (a) is a diagram showing a configuration of a power converter according to the fourth embodiment of the present invention.
Figure 7:
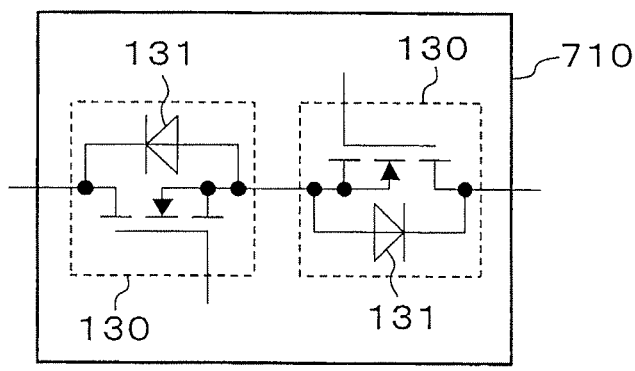

FIG. 7 (*a*) shows a configuration of a power converter according to the fourth embodiment of the present invention. This power converter (700) is a matrix converter in which bidirectional switches (710) using a switching element are arranged at nine combinable contact points between the lines from a three-phase a.c. power supply (30) and the stator lines of a three-phase a.c. motor (20), and directly converts the input a.c. voltage into an output a.c. voltage without once converting the input into d.c. voltage. Since a matrix converter includes a lower number of conducting elements, it is theoretically possible to make it compact and highly efficient. Because the switching element (710) used for the matrix converter needs to be bidirectionally conductive, in the present embodiment the switching element (710) is configured by pointing two SiC MOSFETs (130) in opposite directions and connecting in series, as shown in FIG. 7 (b).

In each of the above embodiments, SiC MOSFET was illustrated as one example of a unipolar device using a wideband gap semiconductor. However, a similar configuration may be considered with unipolar devices using another wideband gap semiconductor such as GaN, diamond or the like.

INDUSTRIAL APPLICABILITY

As described heretofore, a power converter according to the present invention is effective in being applied to an air condition or the like in which the efficiency under light load conditions is more important than the efficiency in the rated load condition.

The invention claimed is:

1. A power converter configured so as to perform synchronous rectification by a switching element, wherein
the switching element is comprised of a unipolar device using a wideband gap semiconductor and including a body diode,
the body diode of the unipolar device is used as a freewheeling diode to circulate the magnetic energy of an inductance, without the need of providing a separate external freewheeling diode connected in parallel to the unipolar device,
the unipolar device turns on when a reverse current flows through the body diode used as the freewheeling diode, so that the reverse current flows through the unipolar device side to thereby perform synchronous rectification,
power is converted from direct current to alternating current, or from alternating current to alternating current,
the body diode turns on if a voltage is increased up to a predetermined amount or more when synchronous rectification is carried out,
a turn-on voltage of the body diode is about 3V and higher than an ON voltage of the unipolar device, and
SiC is used as the wideband gap semiconductor.

2. The power converter of claim 1, wherein the power converter is used for an air conditioner.

3. The power converter of claim 2, wherein a relationship between an effective current value ($I_{rms}$) and an on-resistance ($R_{on}$) of the switching element under an intermediate load condition of heating operation of the air conditioner, satisfies: $I_{rms}<0.9/R_{on}$.

4. The power converter of claim 1, wherein the unipolar device is a MOSFET.

5. The power converter of claim 1, wherein, of an inverter, converter, matrix converter and boosting chopper circuit which are constructed to perform synchronous rectification by the switching element, at least one is included.

6. The power converter of claim 1, wherein a turn-on voltage of the body diode of the unipolar device is about 3 volts.

* * * * *